(12) United States Patent
Murayama

(10) Patent No.: US 6,424,668 B1
(45) Date of Patent: Jul. 23, 2002

(54) SEMICONDUCTOR LASER DEVICE HAVING AN SBR STRUCTURE

(75) Inventor: Minoru Murayama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/351,803

(22) Filed: Jul. 13, 1999

(30) Foreign Application Priority Data

Jul. 15, 1998 (JP) .......................................... 10-200435

(51) Int. Cl.⁷ .................................................. H01S 5/00
(52) U.S. Cl. ............................ 372/45; 372/43; 372/20; 372/46; 372/50
(58) Field of Search ............................. 372/45, 46, 50, 372/20, 43

(56) References Cited

U.S. PATENT DOCUMENTS 5,592,502 A * 1/1997 Matsumoto et al. .......... 372/45
5,619,520 A * 4/1997 Sasai et al. .................... 372/46
6,009,112 A * 12/1999 Uchida et al. ................. 372/46
6,118,800 A * 9/2000 Kidoguchi et al. ............ 372/46

* cited by examiner

Primary Examiner—Paul Ip
Assistant Examiner—Cornelius H. Jackson
(74) Attorney, Agent, or Firm—Hoffman & Baron, LLP

(57) ABSTRACT

A semiconductor laser device includes a substrate formed of GaAs. A lower electrode is formed on an underside of this substrate. Formed, on a top surface of the substrate, are a lower cladding layer, an active layer and a first upper cladding layer. A ridge including a second upper cladding layer is formed on the first upper cladding layer. A current restricting layer is formed in a manner of clamping this ridge from both sides. A contact layer is formed on the ridge and current restricting layer. A third upper cladding layer is formed between the ridge and current restricting layer and the contact layer.

6 Claims, 3 Drawing Sheets

(A)

(B)

(C)

SEMICONDUCTOR LASER DEVICE HAVING AN SBR STRUCTURE

BACKGROUND OF THE INVENTION

1. Field of the Invention

This invention relates to semiconductor laser devices and, more particularly, to a semiconductor laser device of an SBR (Selected Buried Ridge stripe) structure used for digital video discs, magnet-optical discs, laser printers, and the like.

2. Description of the Prior Art

A conventional semiconductor laser device 1 of this kind, as shown in FIG. 3, includes a substrate. On the substrate 2 are formed a buffer layer 3, a lower cladding layer 4a, an active layer 5, a first upper cladding layer 4b and an etch stop layer 6, in this order. A ridge 8a is formed on the etch stop layer 6 by conducting etching after crystal growth. This ridge 8a includes a second cladding layer 4c and an intermediate contact layer 7a. A current restricting layer 8b is formed on the etch stop layer 6 in a manner clamping the ridge 8a from both sides. A GaAs contact layer 7b is formed on the ridge 8a as well as current restricting layer 8b. Further, electrodes 9a and 9b are formed respectively on an underside of the substrate 2 and on a top surface of the GaAs contact layer 7b.

In an attempt to make this semiconductor laser device 1 compatible with an increase in output power, if the light in the active layer 5 is allowed to partly outdiffuse, the light density within the active layer 5 will be decreased. In such a case, if the outdiffused light from the active layer 5 reaches the optical-absorbent GaAs contact layer 7b and is absorbed by the same layer, the semiconductor laser device 1 possibly deteriorates in characteristics. Due to this, it has been a conventional practice to increase the wall thickness of the ridge 8a, thereby increasing a distance L between the active layer 5 and the GaAs contact layer 7b and hence preventing the light from arriving at the GaAs contact layer 7b.

In the prior art, the deterioration in laser characteristic resulting from output power increase has been prevented by thus increasing the wall thickness of the ridge 8a. This, however, has resulted in an increase in side etch amount on the ridge 8a upon implementing an etching process for providing the ridge 8a, resulting in narrowed top end width (current passage width) of the ridge 8a. Thus, there has been a problem that the device is increased in series resistance leading to an increase in operating voltage.

SUMMARY OF THE INVENTION

Therefore, it is a primary object of the present invention to provide a novel semiconductor laser device.

It is another object of the present invention to provide a semiconductor laser device having an SBR structure which can prevent against degradation in laser characteristic due to increase of output without incurring increase in device series resistance.

A semiconductor laser device according to the present invention, comprises: a substrate; a lower cladding layer, an active layer and a first upper cladding layer which are formed in order on the substrate; a ridge formed on the first upper cladding layer, the ridge including a second upper cladding layer; a current restricting layer formed in a manner clamping the ridge; a contact layer formed on the ridge and the current restricting layer; and a third upper cladding layer formed between the ridge and current restricting layer and said contact layer.

The distance of from the active layer to the contact layer is secured sufficiently long by thus forming the third upper cladding layer between the ridge and current restricting layer and the contact layer. Consequently, there is no fear that the outdiffused light from the active layer arrive at the contact layer.

According to the present invention, because there is no need to increase the thickness of the ridge as conventionally done, it is possible to prevent the width of a ridge top end from being narrowed due to side over-etch on the ridge. Thus, the deterioration in laser characteristic due to output power increase can be prevented without incurring increase in series resistance.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
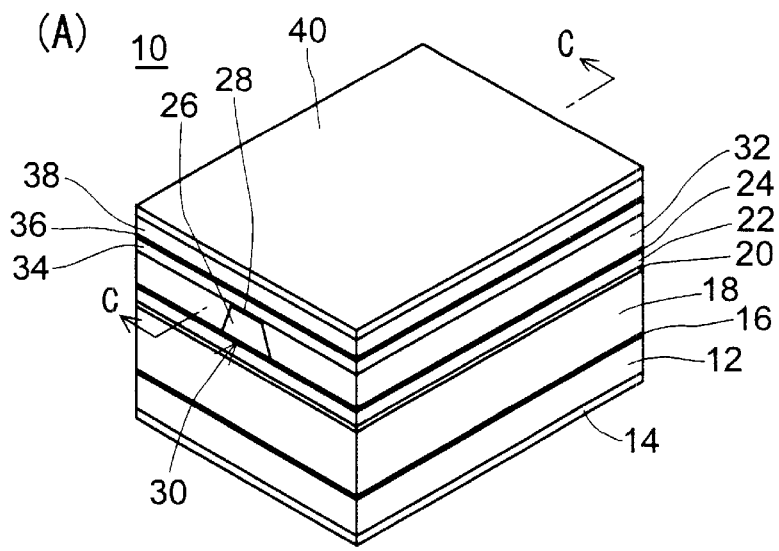
FIG. 1 is an illustrative view showing one embodiment of the present invention.
Figure 1:
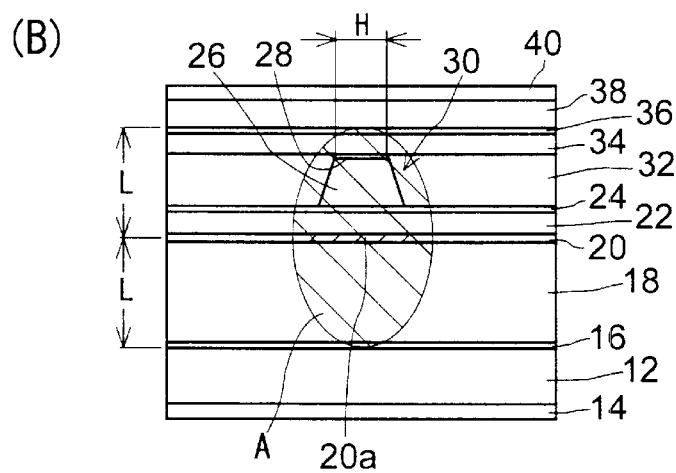
Figure 1:
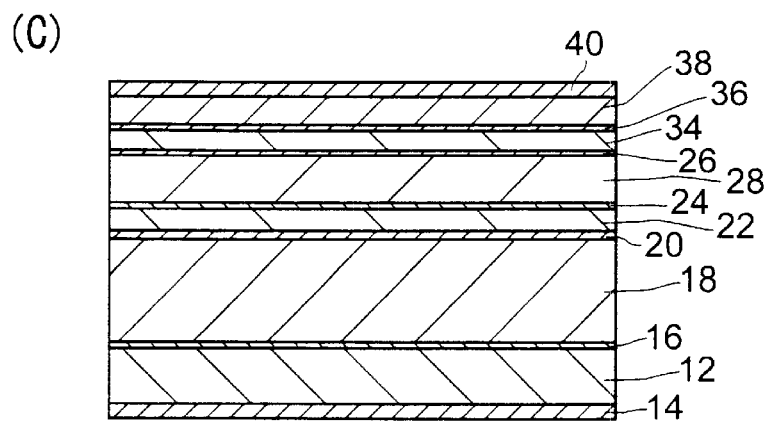

A semiconductor laser device 10 of this embodiment, shown in FIG. 1, includes an n-type substrate formed, for example, of GaAs. On an underside of the substrate 12, a lower electrode 14 is formed based on Au.

On the other hand, the substrate 12 has, on a top surface, an n-type buffer layer 16 formed for example of GaAs, an n-type lower cladding layer 18 formed for example of InGaAlP, an active layer 20 formed for example of InGaP/InGaAlP, such as $In_z Ga_{1-zy}Al_yP$ where ($0 \leq y \leq 1$) ($0 < z < 1$), a p-type first upper cladding layer 22 for example of InGaAlP, and a p-type edge stop layer for example of InGaP, in this order.

On the etch stop layer 24, a ridge 30 is formed to have a p-type second upper cladding layer 26 formed for example of InGaAlP and a p-type intermediate contact layer 28 formed for example of InGaP. An n-type current restricting layer 32 is formed for example of GaAs in a manner of clamping this ridge 30.

On the ridge 30 and current restricting layer 32, formed are a p-type third cladding layer 34 for example of $InGa_{1-x}Al_xP(0.4 \leq X \leq 1)$, a p-type intermediate bandgap layer 36 for example of InGaP and a contact layer 38 of an optical absorbent such as GaAs. An upper electrode 40 is formed based on Au on a top surface of the contact layer 38. Consequently, the active layer 20, has a corresponding portion to the ridge 30 which acts as an optical waveguide 20a to produce and guide laser light therein.

Explanation will be made below on a method for concretely manufacturing a semiconductor laser device 10, wKith reference to FIG. 2A–FIG. 2E.

Figure 2A:
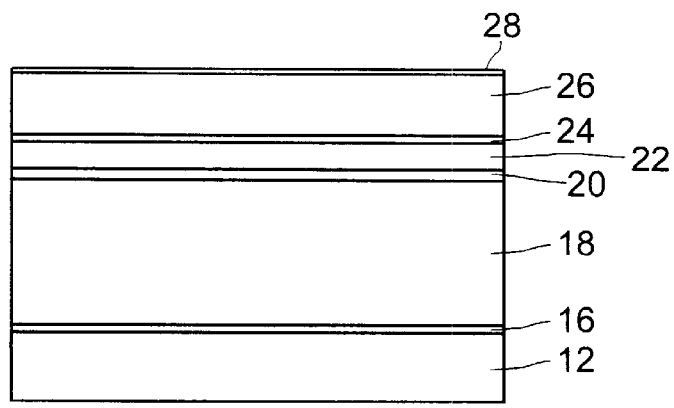
FIG. 2A–FIG. 2E are illustrative views showing a manufacturing process for the FIG. 1 embodiment.

First, formed overlying a substrate 12, as shown in FIG. 2A, are a buffer layer 16 to a thickness of 100–200 Å, a lower cladding layer to 18–1.3 μm, an active layer 20 to 500–1000 Å, a first upper cladding layer 22 to 2000–4000 Å, an etch stop layer 24 to 100–300 Å, a second upper cladding layer 26 to 0.6–1.5 μm, and an intermediate contact layer 28 to 100–300 Å, by a Metal Organic Chemical Vapor Deposition process (hereinafter referred to as "MOCVD process") or Molecular Beam Epitaxial growth process (hereinafter referred to as "MBE process").

Figure 2B:
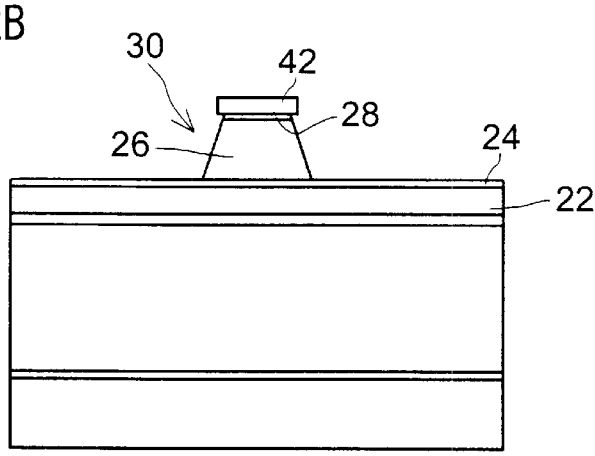

Then, as shown in FIG. 2B, a mask 42 of an SiO$_2$ film is formed in a stripe form on the intermediate contact layer 28 by using a photolithographic technique. Using this mask 42, etching is conducted on the intermediate contact layer 28 and second upper cladding layer 26 to form them into a ridge 30. At this time, the edge stop layer 24 serves as a block against etching. Accordingly, undesirable etching does not occur on the first upper cladding layer 22.

Figure 2C:
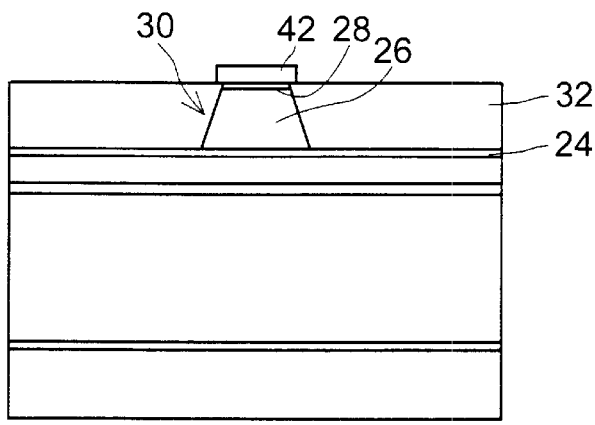

Then, as shown in FIG. 2C, a current restricting layer 32 is formed overlying the edge stop layer 24 up to a height equivalent to a top surface of the ridge 30, by an MOCVD or MBE process.

Figure 2D:
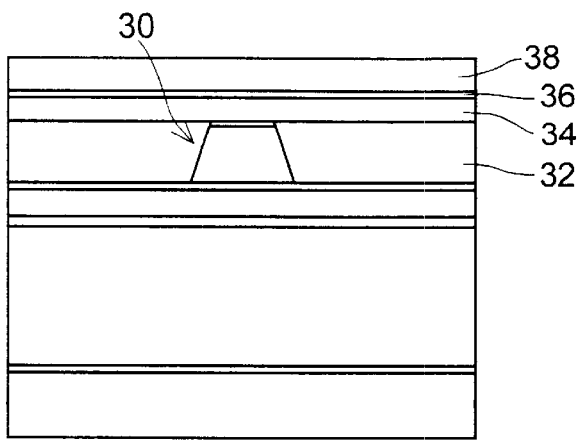

Subsequently, the mask 42 is removed away. Thereafter, formed on the ridge 30 and current restricting layer 32, as shown in FIG. 2D, a third upper cladding layer 34 to a thickness of 0.3–1.0 μm, an intermediate bandgap layer 36 to 300–1000 Å, and a contact layer 38 to 0.5–3 μm, by the MOCVD or MBE process.

Figure 2E:
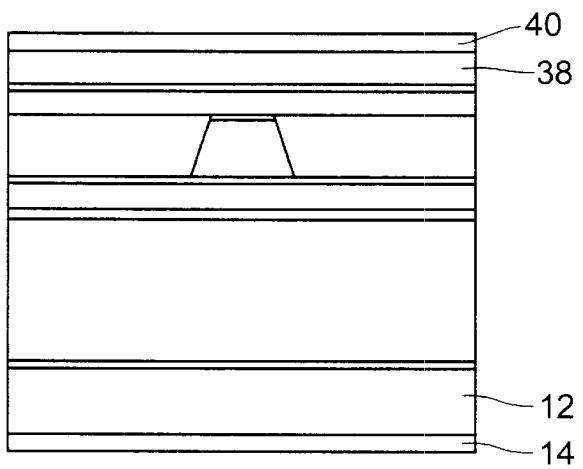
Figure 3:
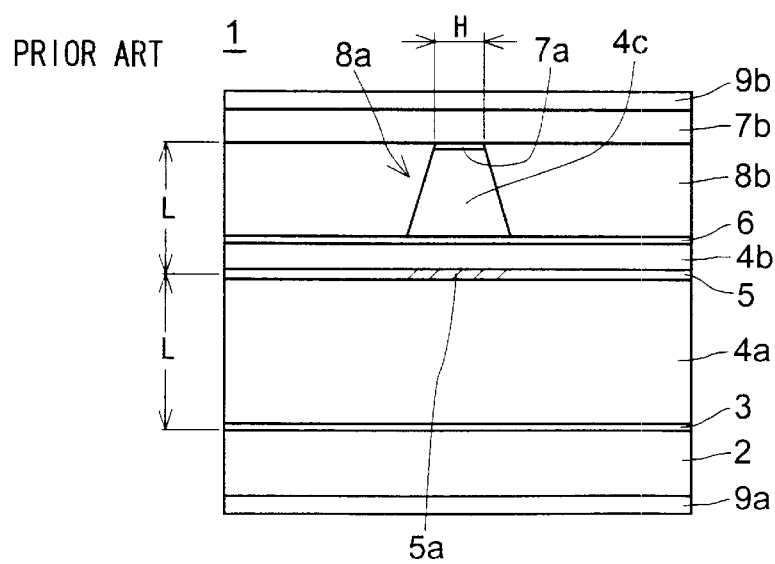
FIG. 3 is an illustrative view showing a prior art.

Thereafter, as shown in FIG. 2E, a lower electrode 14 is formed on an underside of the substrate 12 by evaporation or the like, while an upper electrode 40 is formed on a top surface of the contact layer 38 by evaporation or the like.

With the semiconductor laser device 10, if a voltage is applied to the lower electrode 14 and upper electrode 40, an electric current is injected from the upper electrode 40 through the contact layer 38, the ridge 30 and the like into the active layer 20. Thereupon, laser oscillation occurs at the underneath of the ridge 30, i.e. within the optical waveguide 20a, thereby producing laser light. This light is allowed to partly outdiffuse into a region "A" shown by hatching in FIG. 1(B), thereby attaining increase of power output.

The light outdiffused from the optical waveguide 20a, if reached and absorbed by the CaAs substrate 12 or the contact layer 38 and absorbed therein, would induce deterioration in laser characteristic, as described before. In this embodiment, however, the lower cladding layer 18 and the third upper cladding layer 34 are controlled in thickness during the crystal growth process (FIG. 2A, FIG. 2D). Due to this, it is possible to obtain respective distances L of from the active layer 20 to the GaAs substrate 12 and to the contact layer 38 sufficiently long for preventing against light arrival to them. Incidentally, because the dimensions of the region "A" (FIG. 1(B)) are varied depending upon an output of the semiconductor laser device 10, the distances L may be set optimal for that output.

According to this embodiment, there is no need to increase the thickness of the ridge 30 in order to prevent light absorption by the GaAs substrate 12 and contact layer 38. This can prevent against sidel over-etch on the ridge 30 and hence decrease in the width H of the ridge top end. Consequently, it is possible to prevent against deterioration in laser characteristics resulting from increase of power output without causing increase of series resistance.

Meanwhile, it is possible to set comparatively freely a thickness of the second cladding layer 26 constituting the ridge 30. This improves the freedom of design and makes it possible to apply the invention also to a self-oscillation laser.

Furthermore, because the intermediate bandgap layer 36 is formed between the third upper cladding layer 34 and the contact layer 38, the current given by the electrode 40 smoothly flows from the contact layer 38 to the third upper cladding layer 34.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, comprising:
   a substrate;
   a lower cladding layer, an active layer, a first upper cladding layer and an etch stop layer which are formed in order on said substrate, said active layer being for laser oscillation therein;
   a ridge formed on said etch stop layer, said ridge including a second upper cladding layer and an intermediate contact layer on a top thereof;
   a current restricting layer formed on both sides of said ridge;
   a contact layer formed on said intermediate contact layer of said ridge and said current restricting layer; and
   a third upper cladding layer formed between said contact layer and both of said intermediate contact layer of said ridge and said current restricting layer.

2. A semiconductor laser device according to claim 1, wherein said contact layer is an optical absorbent.

3. A semiconductor laser device according to claim 1, further comprising an intermediate bandgap layer formed between said third upper cladding layer and said contact layer.

4. A semiconductor laser device according to claim 2, further comprising an intermediate bandgap layer formed between said third upper cladding layer and said contact layer.

5. A semiconductor device according to claim 1, wherein said active layer includes In, Ga, Al, and P.

6. A semiconductor device according to claim 1, wherein said active layer is formed of In$_z$Ga$_{1-zy}$Al$_y$P where ($0 \leq y \leq 1$) ($0 < z < 1$).

* * * * *